United States Patent
Phanse

(10) Patent No.: US 6,823,028 B1
(45) Date of Patent: Nov. 23, 2004

(54) DIGITALLY CONTROLLED AUTOMATIC GAIN CONTROL SYSTEM FOR USE IN AN ANALOG FRONT-END OF A RECEIVER

(75) Inventor: Abhijit M. Phanse, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/570,077

(22) Filed: May 12, 2000

(51) Int. Cl.[7] ............................. H04L 27/08; H04B 1/06
(52) U.S. Cl. .................................... 375/345; 455/234.1
(58) Field of Search ................................ 375/345, 245, 375/316; 455/232.1, 234.1, 239.1, 245.1, 250.1; 341/139

(56) References Cited

U.S. PATENT DOCUMENTS 5,917,865 A * 6/1999 Kopmeiners et al. ....... 375/345
6,704,377 B1 * 3/2004 Hsuan ........................ 375/346
6,748,200 B1 * 6/2004 Webster et al. .......... 455/234.1

* cited by examiner

Primary Examiner—Khai Tran

(57) ABSTRACT

There is disclosed an automatic gain control circuit (AGC) controller for use in a transceiver for operating in a high frequency Ethernet local area network (LAN). The transceiver comprises front-end analog signal processing circuitry capable of transmitting an outgoing analog signal to an external cable via a: transformer, reducing a DC component in an incoming analog signal, and reducing an echo of the outgoing analog signal in the incoming analog signal. The front-end analog signal processing circuitry also comprises an automatic gain control (AGC) circuit for amplifying the incoming analog signal by an adjustable gain factor. The AGC controller comprises: 1) a first circuit for determining an absolute value of an output signal of the front-end analog signal processing circuitry; and 2) comparison circuitry for comparing the absolute value of the output signal to a pre-determined threshold value and generating a gain control signal in response to the comparison. The comparison circuitry sets the gain control signal to a first gain control value if the absolute value exceeds the pre-determined threshold value and sets the gain control signal to a second gain control value if the absolute value does not exceed the pre-determined threshold value. The AGC controller also comprises: 3) a gain adjustment circuit for modifying the adjustable gain factor of the AGC circuit according to the first gain control value and the second gain control value.

20 Claims, 5 Drawing Sheets

DIGITALLY CONTROLLED AUTOMATIC GAIN CONTROL SYSTEM FOR USE IN AN ANALOG FRONT-END OF A RECEIVER

CROSS-REFERENCE TO RELATED APPLICATIONS

The present invention is related to those disclosed in the following U.S. patent applications:

1. Ser. No. 09/570,076, filed concurrently herewith, entitled "FULL DUPLEX GIGABIT-RATE TRANSCEIVER FRONT-END AND METHOD OF OPERATION;"
2. Ser. No. 09/569,957, filed concurrently herewith, entitled "SYSTEM AND METHOD FOR CANCELLING SIGNAL ECHOES IN A FULL-DUPLEX TRANSCEIVER FRONT-END;"
3. Ser. No. 09/570,331, filed concurrently herewith, entitled "SYSTEM AND METHOD FOR MIXED MODE EQUALIZATION OF SIGNALS;"
4. Ser. No. 09/569,828, filed concurrently herewith, entitled "SYSTEM AND METHOD FOR CORRECTING OFFSETS IN AN ANALOG RECEIVER FRONT END;"
5. Ser. No. 09/569,518, filed concurrently herewith, entitled "RECEIVER ARCHITECTURE USING MIXED ANALOG AND DIGITAL SIGNAL PROCESSING AND METHOD OF OPERATION;" and
6. Ser. No. 09/570,078, filed concurrently herewith, entitled "SYSTEM AND METHOD FOR ADAPTING AN ANALOG ECHO CANCELLER IN A TRANSCEIVER FRONT END."

The above applications are commonly assigned to the assignee of the present invention. The disclosures of these related patent applications are hereby incorporated by reference for all purposes as if fully set forth herein.

TECHNICAL FIELD OF THE INVENTION

The present invention is generally directed to high-speed Ethernet local area networks (LANs) and, more specifically, to a digitally controlled automatic gain control system for use in a full-duplex transceiver for a gigabit Ethernet network.

BACKGROUND OF THE INVENTION

The rapid proliferation of local area network (LANs) in the corporate environment and the increased demand for time-sensitive delivery of messages and data between users has spurred development of high-speed (gigabit) Ethernet LANs. The 100BASE-TX Ethernet LANs using category-5 (CAT-5) copper wire and the 1000BASE-T Ethernet LANs capable of one gigabit per second (1 Gbps) data rates over CAT-5 data grade wire require new techniques for the transfer of high-speed symbols.

The transfer of high-speed symbols over an Ethernet LAN requires full-duplex gigabit (Gbps) Ethernet transceivers which transmit and receive data over category-5 copper wire at the 1 Gbps data rate. This full-duplex data transfer occurs over four twisted pairs at 125 mega-symbols (125 Mbaud) per second per pair, which is the same as a transfer rate of 500 mega-symbols (Mbaud) per second in each direction.

In an exemplary system, data is transmitted using a five-level pulse amplitude modulation (PAM-5) technique. In PAM-5, data is represented by five voltage levels, designated as an alphabet symbol {A} represented by data bits with the symbol alphabet having values of −2, −1, 0, 1, 2 volts, for example. The actual voltage levels may differ from these five levels. At each clock cycle, a single one-dimensional (1D) symbol is transmitted on each wire. The four 1D symbols traveling in one direction on each of the conductor pairs at a particular sample time k are considered to be a single four-dimensional (4D) symbol. In addition, extra channel symbols represent Ethernet control characters. Therefore, five level PAM (PAM-5) with either a parity check code or trellis coding is often utilized in Gigabit Ethernet transmission.

At 125 Mbaud, each 4D symbol needs to transmit at least eight bits. Therefore, 256 different 4D symbols plus those required for control characters are required. By transmitting a 4D PAM-5 symbol alphabet, there are $5^4=625$ possible symbols. This number of symbols allows for 100% redundancy in the data as well as for several control codes. Symbol alphabets having more than five symbols yield even greater redundancy.

Another technique for transferring data at high rates is known as non-return to zero (NRZ) signaling. In NRZ, the symbol alphabet {A} has values of −1 and +1 volts. A Logical 1 is transmitted as a positive voltage, while a Logical 0 is transmitted as a negative voltage. At 125 mega-symbols per second, the pulse width of each NRZ symbol (the positive or negative voltage) is 8 nano-seconds.

Another modulation method for high speed symbol transfer is known as multi-level transmit-3 (MLT-3) which uses three voltage levels for the transfer of data. This American National Standard Information (ANSI) approved modulation technique is used for the transfer of data over a 100BASE-TX network using unshielded twisted pairs.

In MLT-3 transmission, a Logic 1 is transmitted as either a −1 or a +1 voltage while a Logic 0 is transmitted as a 0 voltage. Thus, the transmission of two consecutive Logic 1s does not require an MLT-3 system to pass data through zero. The transmission of an MLT-3 logical sequence (1, 0, 1) results in transmission of the symbols (+1, 0, −1) or (−1, 0, +1), depending on the symbols transmitted prior to this sequence. If the symbol transmitted immediately prior to the sequence is a +1, then the symbols (+1, 0, −1) are transmitted. If the symbol transmitted before this sequence is a −1, then the symbols (−1, 0, +1) are transmitted. If the symbol transmitted immediately before this sequence is a 0, then the first symbol of the sequence transmitted will be a +1 if the previous Logic 1 is transmitted as a −1 and will be a −1 if the previous Logic 1 is transmitted at +1.

The signal-to-noise ratio (SNR) required to achieve a particular bit error rate is higher for MLT-3 signaling than for two level systems. The advantage of the MLT-3 system, however, is that the energy spectrum of the emitted radiation from the MLT-3 system is concentrated at lower frequencies and therefore more easily meets Federal Communications Commission (FCC) radiation emission standards for transmission over twisted pair cables.

Other modulation schemes for multi-symbol coding can also be utilized, including quadrature amplitude modulation (QAM). In QAM schemes, for example, the symbols are arranged on two-dimensional (real and imaginary) symbol constellations (instead of the one-dimension constellations of the PAM-5 or MLT-3 symbol alphabets.)

These multi-level symbol representations were not needed prior to the development of higher speed computer networks, since data could be transferred between computers at sufficient speeds and accuracy as binary data. However, the higher gigabit per second Ethernet data rate and other communications schemes requires transmitters and receivers capable of transmitting and receiving data over multiple twisted copper pair using larger symbol alphabets (i.e., 3 or more symbols). There is also a need for transceiver (transmitter/receiver) systems that operate at high symbol rates while maintaining low bit error rates (BERs).

As in other communications systems, the transmission cable (or channel) connecting the transmitter and receiver distorts the shape of the transmitted symbol stream. Each symbol transmitted is diffused in the transmission process so that it is commingled with symbols being transmitted at later transmission times. This effect is known as "intersymbol interference" (ISI) and is a result of the dispersive nature of the communication cable. The transmitted waveform is further changed by the cable transmission characteristics, noise which is added over time, and interfacing devices such as transformers, for instance.

When the high-speed signal is received at the transceiver, it is further modified by the physical and operating characteristics of the receiving transceiver. For instance, the impedance that may be seen by the transceiver front-end not only includes the impedance of the cable and the transformer that couples the cable to the transceiver front-end, but also the impedance of on-board traces and input/output structures. Input/output structures include electrostatic discharge protectors, input/output cells, and the like, that may reside on an integrated circuit before the transceiver front-end components.

Therefore, there is a need in the art for improving the performance of full-duplex transceivers for operation at gigabit per second data rates across local area networks. There is a further need in the art for improving the performance of full-duplex transceiver front-ends to compensate for operational changes due to cable and circuit characteristics as well as the lengths of connecting cable. In particular, there is a need for improved transceiver front-ends which accommodate changes due to manufacturing processes and environmental changes across time. More particularly, there is a need in the art for a high performance full-duplex transceiver front-end which incorporates a system for improving performance by cancelling echos and correcting for signal offsets, as well as adjusting performance due to direct current and data dependent drifts and off-sets.

SUMMARY OF THE INVENTION

To address the above-discussed deficiencies of the prior art, it is a primary object of the present invention to provide an automatic gain control circuit (AGC) controller for use in a transceiver capable of operating in a high frequency Ethernet local area network (LAN). The transceiver comprises front-end analog signal processing circuitry capable of at least one of: 1) transmitting an outgoing analog signal to an external cable via a transformer, 2) reducing a DC component in an incoming analog signal, and 3) reducing an echo of the outgoing analog signal in the incoming analog signal. The front-end analog signal processing circuitry comprises an automatic gain control (AGC) circuit capable of amplifying the incoming analog signal by an adjustable gain factor. According to an advantageous embodiment of the present invention, the AGC controller comprises: 1) a first circuit capable of determining an absolute value of an output signal of the front-end analog signal processing circuitry; 2) comparison circuitry capable of comparing the absolute value of the output signal to a pre-determined threshold value and generating a gain control signal in response to the comparison, wherein the comparison circuitry sets the gain control signal to a first gain control value if the absolute value exceeds the pre-determined threshold value and sets the gain control signal to a second gain control value if the absolute value does not exceed the pre-determined threshold value; and 3) a gain adjustment circuit capable of modifying the adjustable gain factor of the AGC circuit according to the first gain control value and the second gain control value.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OR THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data transceiver.

Figure 1:
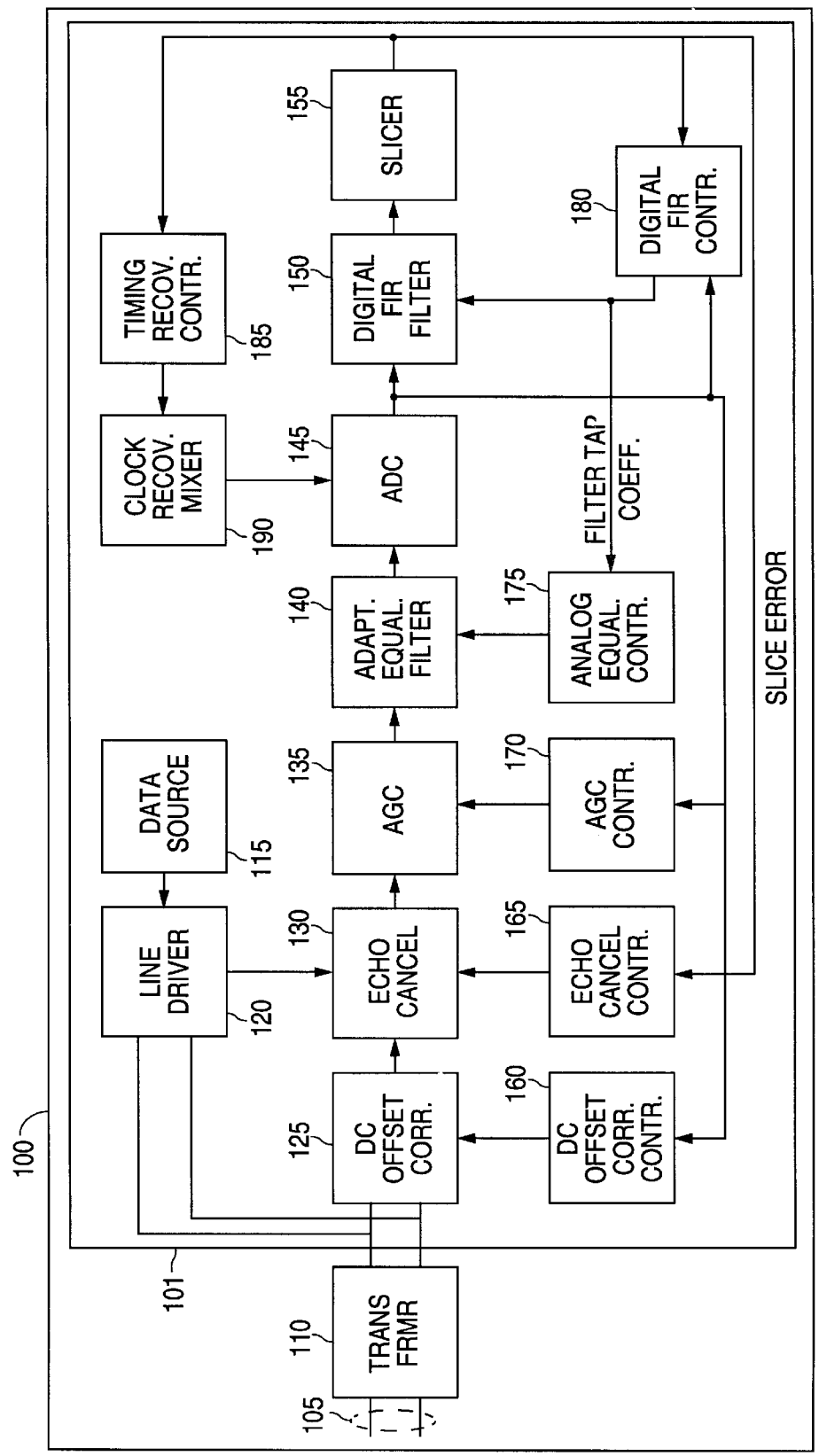
FIG. 1 illustrates an exemplary full-duplex transceiver according to one embodiment of the present invention.

FIG. 1 illustrates exemplary full-duplex transceiver 100 according to one embodiment of the present invention. In an advantageous embodiment of the present invention, full-duplex transceiver 100 is fabricated as a single integrated circuit (IC), represented as IC 101, that is coupled to a local area network (LAN) via cable 105 and transformer 110. The transmit path in full duplex transceiver 100 comprises data source 115 and line driver 120. The receive path in full duplex transceiver 100 comprises an analog front-end portion and a digital portion. The analog front-end comprises DC offset correction circuit 125, echo canceller 130, automatic gain control (AGC) circuit 135, and adaptive equalization filter (AEF) 140. The output of adaptive equalization filter 140 is converted from an analog signal to a digital signal by analog-to-digital converter (ADC) 145. The digital portion of full duplex transceiver 100 comprises digital finite impulse response (FIR) filter 150 and slicer 155.

The operations of the analog components in full duplex transceiver 100 are controlled by DC offset correction controller 160, echo canceller controller 165, AGC controller 170, and analog equalization controller 175. The operation of digital FIR filter 150 is controlled by digital FIR filter controller 180. Full duplex transceiver 100 also comprises timing recovery control circuit 185 and clock recovery mixer 190, which generates a recovered clock signal from the outputs of slicer 155. Timing recovery control circuit 185 and clock recovery mixer 190 use the data signal and error signal from slicer 155 as inputs to a digital phase-locked loop (PLL) circuit. The PLL circuit controls the phase/delay of an analog-based frequency synthesizer which, in turn, produces a low jitter clock centered at the symbol for sampling by ADC 145.

Full duplex transceiver 100 is capable of simultaneously transmitting and receiving analog signals through cable 105, which may be a copper twisted pair cable. Transformer 110 receives outgoing analog data signals from data source 115 through line driver 120 and transmits the outgoing signals to the LAN (not shown) via cable 105. Transformer 110 also receives incoming analog data signals from the LAN via cable 105 and transmits them to direct current (DC) offset correction circuit 125.

DC offset correction circuit 125 generates an offset signal that modifies the incoming analog data signal in order to cancel the systematic offset that accrues during the operation of transceiver 100. Echo canceller 130 receives both the outgoing signal from line driver 120 and the incoming signal from DC offset correction circuit 125 and removes the echoes of the outgoing signal from the incoming signal. In an alternate embodiment of full-duplex transceiver 100, DC offset correction circuit 125 may be omitted and echo canceller 130 may remove the echoes of the outgoing signal from the incoming signal that echo canceller 130 receives directly from transformer 110.

After echo canceller 130 cancels out echoes of the outgoing signal, analog gain control (AGC) circuit 135 automatically adjusts the amplitude of the output of echo canceller 130 to the desired signal level based on the slicer levels of slicer 155 and transmits the amplified analog data signals to adaptive equalization filter (AEF) 140. AEF 140 provides signal equalization by providing a high frequency boost to correct the analog data signal loss in cable 105. The amount of the high frequency boost provided by AEF 140 changes with the length of cable 105. Analog-to-digital converter (ADC) 145 converts the filtered analog data signals from AEF 140 to digital signals.

The digital output signals from ADC 145 are then transferred to digital finite impulse response (FIR) filter 150 and to data slicer 155. The filter tap coefficients of digital FIR filter 150 are used to adjust the equalization of AEF 140. Slicer 155 detects the five levels of the PAM-5 signal and generates both an output data signal and an output error signal. Slicer 155 determines the error between the signal levels of the data symbols generated by digital FIR filter 150 and the ideal signal levels of the modulation technique. For example, in a five-level pulse amplitude modulation (PAM-5) system, data is represented by five voltage levels, designated as an alphabet symbol having values of −2, −1, 0, +1, +2 volts. If slicer 155 receives a voltage level of, for example, +1.15 volts, slicer 155 determines that the received signal level was supposed to be +1.0 volts and cuts off the +0.15 volt error signal. The slicer error signals are used to control the amount of echo cancellation and to determine the values of the filter tap coefficients used by digital FIR filter 150.

During normal operation, AGC 135 and AGC controller 170 amplify the incoming signal to a level that is sufficiently below the maximum limits of ADC 145 such that the expected maximum signal peaks of the incoming signal are not large enough to saturate ADC 145. However, in some embodiments, the signal levels of the output of ADC 145 may not match the signal levels expected by slicer 155. That is, it may not be possible to operate ADC 145 to reach the signal levels suitable for slicer 155 without sacrificing the extra headroom needed to prevent saturation of ADC 145. To compensate for this, in an advantageous embodiment of the present invention, digital FIR filter 150 may also apply a flat gain to the digital output of ADC 145 in addition to applying signal equalization to the output of ADC 145. The gain applied by digital FIR filter 150 may scale up or scale down the digital output signals from ADC 145.

Figure 2A:
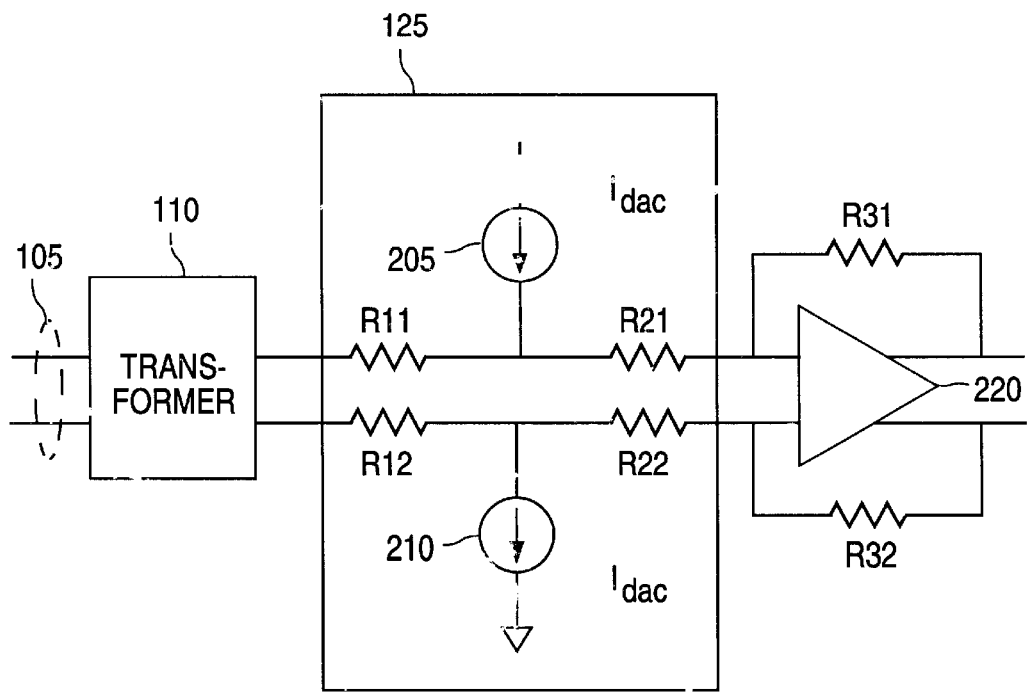
FIG. 2A illustrates in greater detail an exemplary DC offset correction circuit according to one embodiment of the present invention.

FIG. 2A illustrates in greater detail exemplary DC offset correction circuit 125 according to one embodiment of the present invention. DC offset voltage accumulates in the front-end of the receiver due to process mismatches, manufacturing variations, and data-dependent offset (due to mismatched positive and negative pulses through a band-width limited channel). DC offset correction circuit 125 provides a differential offset to cancel the systematic offset accrued in the analog front end of full-duplex transceiver 100.

DC offset correction circuit 125 comprises adjustable current sources 205 and 210, which are controlled by digital-to-analog converters that convert a digital control signal from DC offset correction controller 160 to produce the analog offset current $I_{dac}$. Depending on the positive or negative level of the DC offset correction, the offset current may flow from adjustable current source 205 to adjustable current source 210 through resistor R11, transformer 110 and resistor R12, or it may flow in the reverse direction. If the bias current flows from adjustable current sources 205 to adjustable current source 210, the junction between resistors R11 and R21 is biased to a higher voltage than the junction between resistors R12 and R22. If the bias current flows from adjustable current sources 210 to adjustable current source 205, the junction between resistors R11 and R21 is biased to a lower voltage than the junction between resistors R12 and R22. The bias voltage applied to resistors R21 and R22 is then amplified by amplifier 220 in the receive path circuitry according to the value of the feedback resistors R31 and R32. An N bit word from DC offset correction controller 160 controls $I_{dac}$ from $-I_{max}$ to $+I_{max}$. The equal and opposite (sourcing and sinking) currents flow into the differential data path as described above to produce a differential output offset correction signal at the output of amplifier 220.

Figure 2B:
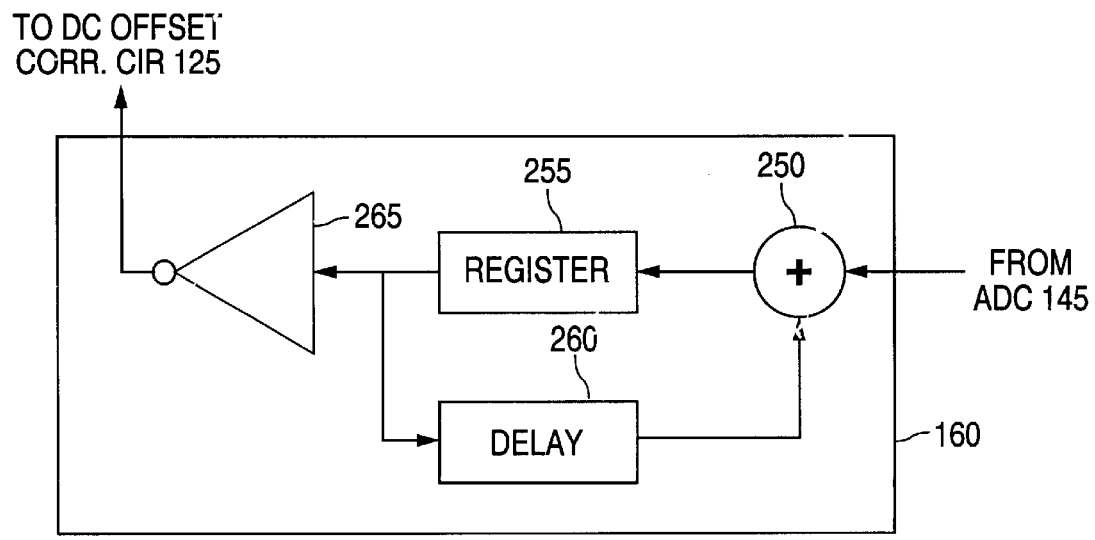
FIG. 2B illustrates in greater detail an exemplary DC offset correction controller according to one embodiment of the present invention.

FIG. 2B illustrates in greater detail exemplary DC offset correction controller 160 according to one embodiment of the present invention. The output of ADC 145 is digitally filtered. This filtered output represents the average signal level through the analog front end of full duplex transceiver 100. If the code being received at ADC 145 is DC balanced (i.e., no DC component), the output of DC offset correction controller 160 represents the DC offset which is accrued through the channel and the analog front end. DC offset correction controller 160 uses this filtered output (with negative feedback) to correct for the accrued offset in DC offset correction circuit 125.

DC offset correction controller 160 comprises digital adder 250, register 255, delay element 260, and digital inverter 265. One input to adder 250 receives a current data sample from the output of ADC 145. The output of ADC 145 may be a positive or a negative value. The other input receives from delay element 260 the previous contents of register 255. The sum from adder 250 is then written as the new value in register 255. The output of register 255 is inverted by inverter 265 to provide a negative feedback signal to DC offset correction circuit 125. If the output of ADC 145 contains either a positive or a negative DC component due to accrued offset, the average value in register 255 is accordingly affected. The negative feedback provided by DC inverter 265 then reduces or increases the value of $I_{dac}$ in DC offset correction circuit 125 in order to reduce or to eliminate the positive or negative DC component caused by the accrued DC offset.

Advantageously, DC offset correction controller 160 can be used to cancel process-related DC offsets and dynamic data dependent offsets (such as base line wander) at the front of the analog front end so as to relax the headroom requirements of the analog front end and ADC 145. This leads to a robust implementation of full duplex transceiver 100 that is immune to mismatches and process-related variances.

Figures 3A, 3B:
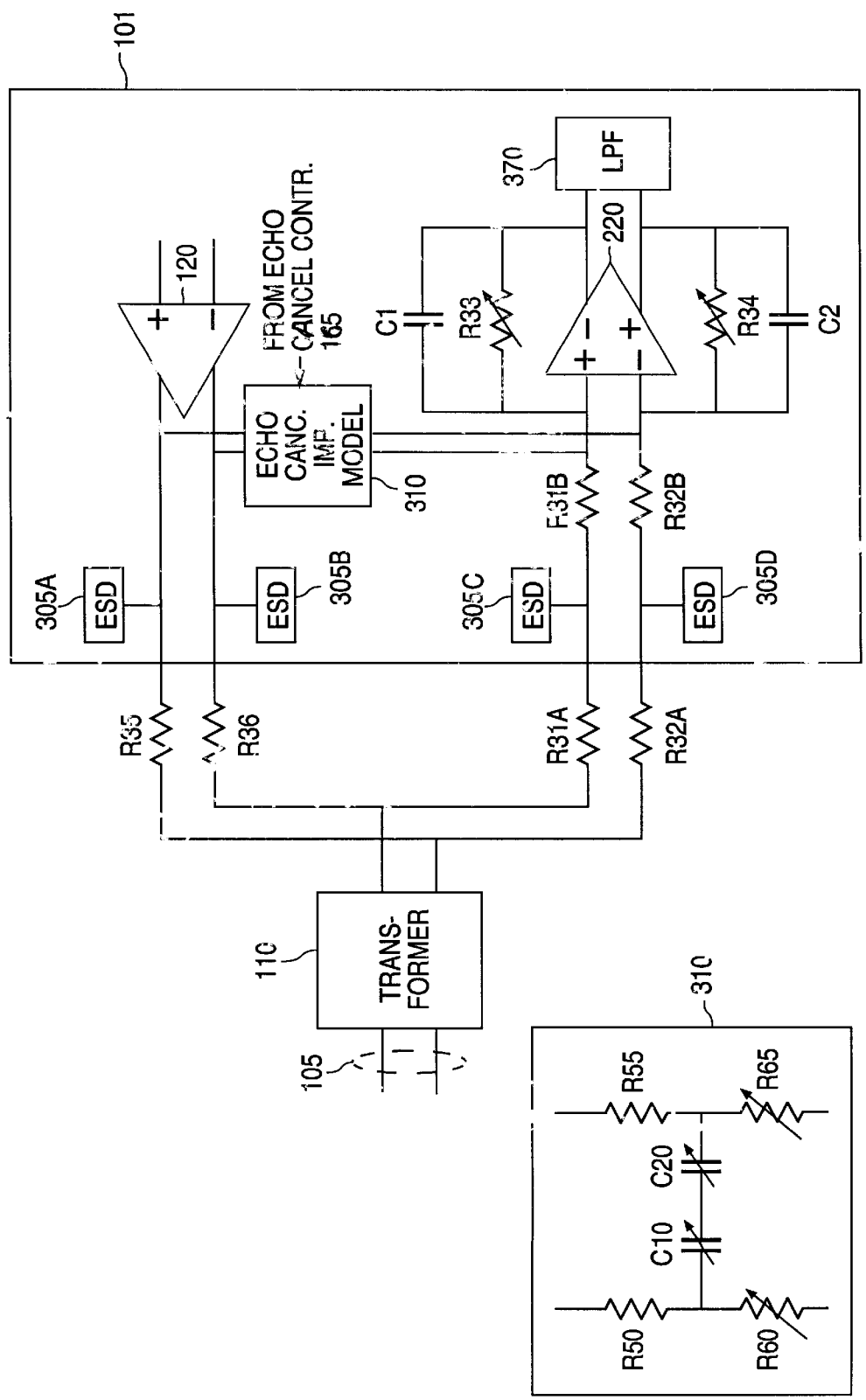
FIG. 3A illustrates in greater detail an exemplary echo cancellation circuit according to one embodiment of the present invention.
FIG. 3B illustrates in greater detail the exemplary impedance cancellation model according to one embodiment of the present invention.

FIG. 3A illustrates in greater detail selected portions of exemplary echo cancellation circuit 130 according to one embodiment of the present invention. Echo cancellation circuit 130 comprises echo cancellation impedance model circuit 310 and amplifier 220. FIG. 3B illustrates in greater detail exemplary echo impedance cancellation model circuit 310 according to one embodiment of the present invention. In a full-duplex system, data is simultaneously transmitted and received on cable 105. An echo canceller is required in the receive path to cancel the transmitted signal, so that the received signal can be correctly recovered. Echo cancellation circuit 130 works on the principle of subtracting an estimate of the transmit signal from the full-duplex (receive+echo) signal on cable 105. To accomplish this, echo cancellation circuit 130 receives a copy of the transmit signal from data source 115 (connection not shown in FIG. 1 to simplify drawing). The signal transmitted on cable 105 depends on the impedance presented to IC 101 (i.e., the effective impedance of cable 105 and transformer 110). Echo cancellation circuit 130 replicates the external impedance presented to IC 101 in order to estimate the transmitted signal.

The impedance presented to IC 101 depends on the characteristic impedance of cable 105, the impedance of transformer 110, the impedance of the on-board traces, and input/output (I/O) impedance of IC 101 (which could be electrostatic discharge devices (ESD) 305A–305D and I/O cells). The effective impedance presented to IC 101 varies due to the manufacturing tolerances of the above mentioned components. Ideally, echo cancellation circuit 130 has the required degrees of freedom and range for replicating the external impedance within the expected manufacturing tolerances.

The architecture of echo cancellation circuit 130 depends on the architecture of the transmitter that drives the signal onto cable 105. The transmitter (i.e., line driver 120) may be a current-mode driver or a voltage mode driver. Off-chip cable terminations, such as R35, R36, R31A and R32A, and the on-chip circuitry, in conjunction with the magnetics of transformer 110 and cable 105, perform the echo cancellation function. Echo cancellation impedance model circuit 310 comprises adjustable resistors and capacitors that are tuned to account for variations in the magnetics, cable impedance, and board parasitic losses. The adjustable resistors comprise arrays of resistors that may be placed in various series and parallel combinations by opening and closing switches controlled by echo cancellation controller 165. Similarly, the adjustable capacitors comprise arrays of capacitors that may be placed in various series and parallel combinations by opening and closing switches controlled by echo cancellation controller 165.

Echo cancellation controller 165 and echo cancellation impedance model circuit 310 provide high performance echo cancellation with only two degrees of tuning. The resistor (R50, R55, R60 and R65) tuning accounts for the flat (DC) variation of the characteristic impedance of cable 105. The capacitor (C10 and C20) tuning accounts for changes in the effective bandwidth in the echo path (due to variations in transformer 110, ESD variations and board capacitance).

The two paths, echo and echo canceller, are the shortest possible and consist only of passive elements. Mismatches in these two paths can lead to residual uncancelled echo. These mismatches are kept to a minimum due to the absence of active elements (and other complexity). This leads to a very robust design, which is insensitive to process offsets.

An echo canceller according to the principles of the present invention places a pole in the path of the residual echo to damp out the zero (peaking) in the impedance of transformer 110. Thus, the echo canceller can be implemented as a single pole response, which makes it easier to adapt (as opposed to adapting a zero and a few poles to implement a bandpass response). Low-pass filter (LPF) 370 at the end of the echo canceller attenuates uncancelled high-frequency echo. The uncancelled high-frequency echo may be due to: a) differences between echo cancellation impedance model circuit 310 and the impedance of the echo path at high frequencies, primarily arising from the impedance peaking of transformer 110; and b) errors arising from mismatches in the two signals (i.e., two signal paths) being subtracted.

Figure 4A:
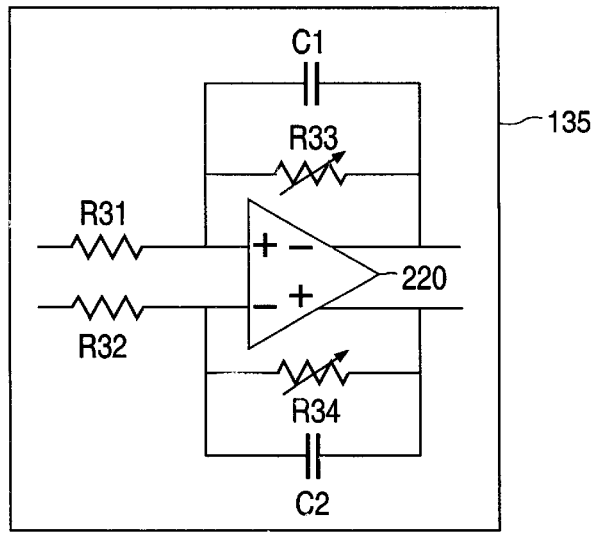
FIG. 4A illustrates in greater detail an exemplary automatic gain control (AGC) circuit according to one embodiment of the present invention.

FIG. 4A illustrates in greater detail exemplary automatic gain control (AGC) circuit 135 according to one embodiment of the present invention. AGC circuit 135 comprises amplifier 220, resistors R31, R32, R33, and R34, and capacitors C1 and C2 in a programmable gain configuration. Gain is programmed by adjusting the resistance values of adjustable resistors R33 and R34. Adjustable resistors R33 and R34 comprise arrays of resistors that may be placed in various series and parallel combinations by opening and closing switches controlled by AGC controller 170.

Figure 4B:
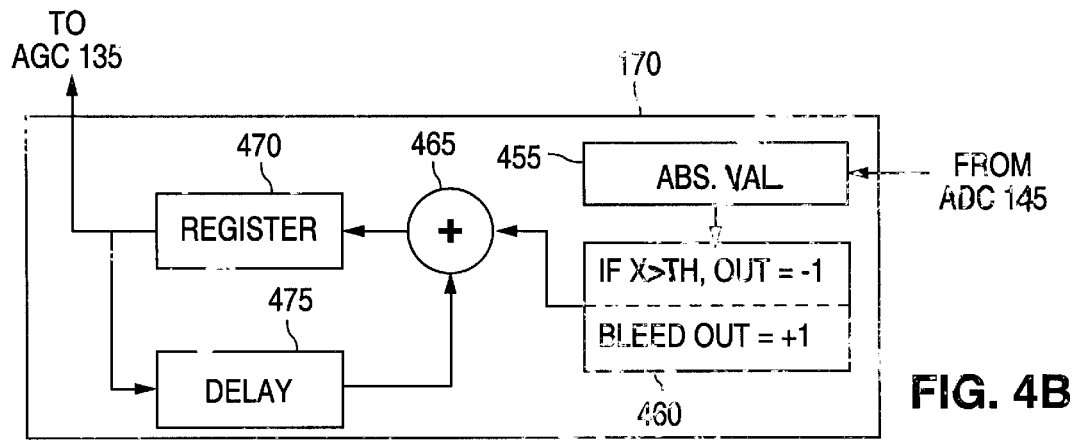
FIG. 4B illustrates in greater detail an exemplary AGC controller according to one embodiment of the present invention.

FIG. 4B illustrates in greater detail exemplary AGC controller 170 according to one embodiment of the present invention. AGC controller 170 comprises a digital peak detector that captures the peak of the output of ADC 145 and compares it with a threshold value, $TH_{(AGC)}$. If the absolute value of the output of ADC 145 is greater than threshold $TH_{(AGC)}$ then the AGC gain is decremented with a predetermined time constant. Otherwise, the AGC gain continuously increments at a relatively slow bleed rate.

In an advantageous embodiment of the present invention, AGC controller 170 comprises absolute value circuit 455, comparison logic circuit 460, adder 465, register 470, and delay element 475. Absolute value circuit 455 determines the absolute value of a sample received from ADC 145 by determining the magnitude of the sample. Comparison logic circuit 460 compares the absolute value to predetermined threshold $TH_{(AGC)}$. The output of comparison logic circuit 460 may increment or decrement the value in register 470 depending by outputting a +1 or a −1. If the absolute value is greater than threshold $TH_{(AGC)}$, the output of comparison logic circuit 460 is −1. If the absolute value is less than or equal to threshold $TH_{(AGC)}$, comparison logic circuit 460 is normally 0, but periodically changes to +1 at a predetermined bleed rate. The bleed rate is relatively low so that register 470 increments only slowly.

One input of adder 465 receives the output (+1 or −1) of comparison logic circuit 460. The other input of adder 465 receives from delay element 475 the previous contents of register 470. The sum from adder 465 is then written as the new value in register 470. The output of register 470 provides a negative feedback signal to AGC circuit 135. If the absolute value of the output of ADC 145 is too high, the gain of AGC circuit 135 is accordingly reduced by the feedback signal. If the absolute value of the output of ADC 145 is not too high, the gain of AGC circuit 135 is slowly increased by the feedback signal.

Figure 5:
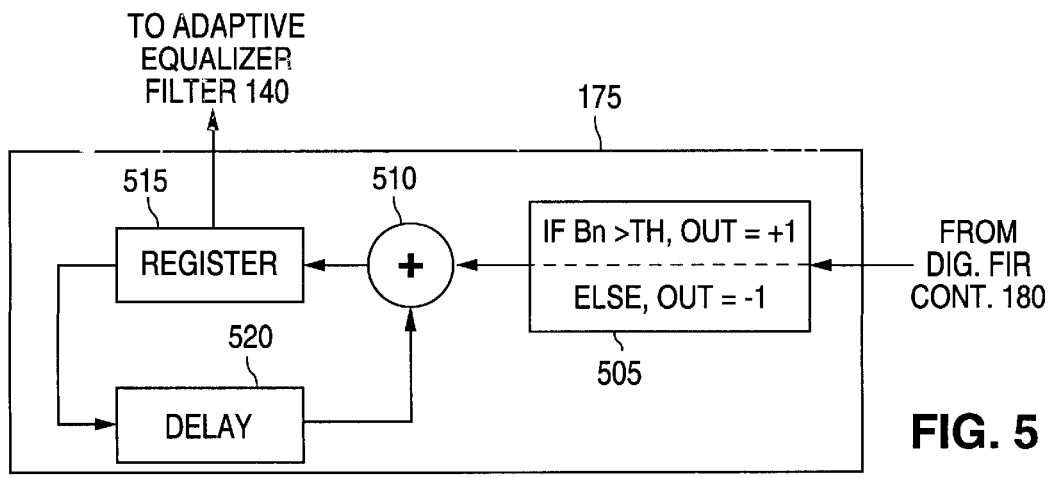
FIG. 5 illustrates in greater detail an exemplary adaptive equalization (EQ) controller according to one embodiment of the present invention.

The present invention implements a mixed mode equalization in which analog equalization is performed by adaptive equalization filter 140 and digital equalization is performed by digital FIR filter 150. The mixed mode equalization occurs in alternating digital and analog stages until convergence (or a time out) occurs. FIG. 5 illustrates in greater detail exemplary adaptive equalization (EQ) controller 175 according to one embodiment of the present invention. Adaptive EQ controller 175 comprises comparison logic circuit 505, adder 510, register 515 and delay circuit 520. Comparison logic circuit 505 receives one or more of the digital filter coefficients ($B_n$) from digital filter FIR controller 180 and compares at least one of the received coefficients to a predetermined convergence threshold, $TH_{(AEF)}$. If the coefficient is greater than convergence threshold $TH_{(AEF)}$, comparison logic circuit 505 outputs a +1. If the coefficient is less than or equal to convergence threshold $TH_{(AEF)}$, comparison logic circuit 505 outputs a −1.

One input of adder 510 receives the output (+1 or −1) of comparison logic circuit 505. The other input of adder 510 receives from delay element 520 a prior value stored in register 515, depending on the number of clock cycle delays introduced by delay circuit 520. The sum from adder 510 is then written as the new value in register 515. The output of register 515 provides a control feedback signal to AEF 140. If the value of the digital FIR coefficient is too high ($B_n > TH_{(AEF)}$), the value in register 515 is incremented to increase the amount of analog equalization that occurs. This leads to a corresponding reduction in the amount of digital equalization that is needed, thereby reducing the value of the digital coefficient received by analog equalization controller 175. If the value of the digital FIR coefficient is not above the convergence threshold $TH_{(AEF)}$, the value in register 515 is automatically decremented to decrease the amount of analog equalization that occurs. This leads to a corresponding increase in the amount of digital equalization that is needed, thereby increasing the value of the digital coefficient until it reaches the convergence threshold $TH_{(AEF)}$.

Figure 6:
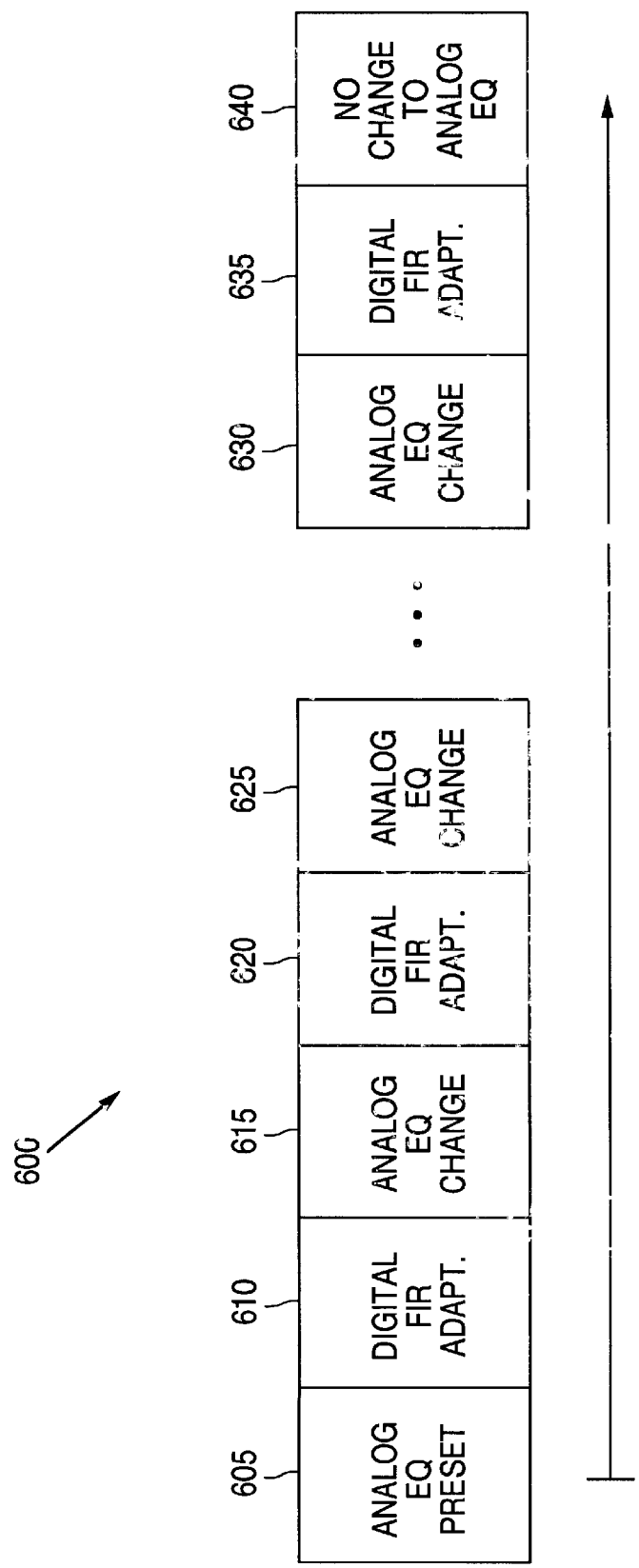
FIG. 6 is a flow diagram illustrating the mixed mode equalization operation of the exemplary full-duplex transceiver according to one embodiment of the present invention.

FIG. 6 depicts flow diagram 600, which illustrates the mixed mode equalization operation of exemplary full-duplex transceiver 100 according to one embodiment of the present invention. The mixed mode adaptive equalization filter provides signal equalization in the form of a high frequency boost that offsets cable loss. The amount of high frequency boost of the equalizer adapts to the length of the attached cable. Adaptive equalization filter (AEF) 140 is controlled (adapted) in conjunction with digital FIR filter 160. The mixed mode equalization scheme provides some analog and some digital equalization to compensate for the overall attenuation of the channel. AEF 140 is incremented or decremented according to the predetermined converged value of digital FIR filter 160.

Initially, AEF 140 is set to a preset value (process step 605). For the initial setting of AEF 140, slicer 155 generates a slicer error signal. To reduce or eliminate the slicer error, digital filter controller 180 modifies the filter tap coefficients so that digital FIR filter 160 is adjusted to provide gain sufficient to compensate the channel (process step 610). Based on the converged value of the modified coefficients of digital FIR filter 160, AEF 140 is incremented or decremented so as to partition the optimal balance of gain in the analog and digital data paths for optimal signal-to-noise (SNR) and signal processing requirements (process step 615).

In response to the changes made by AEF 140, slicer 155 generates a new slicer error signal. Again, to reduce or eliminate the slicer error, digital filter controller 180 re-adjusts the filter tap coefficients so that digital FIR filter 160 is adjusted to provide gain sufficient to compensate the channel (process step 620). In response to the new converged value of the modified coefficients of digital FIR filter 160, AEF 140 again is incremented or decremented in order to partition the optimal balance of gain in the analog and digital data paths (process step 625).

The above-described mixed mode equalization operation continues in subsequent process steps (such as exemplary process steps 630 and 635) until the coefficients of digital FIR filter 160 converge to the pre-determined threshold value, $TH_{(AEF)}$. At this point, no further adaptation of AEF 140 is required (process step 640) and the operation is complete.

Although the present invention has been described in detail, those skilled in the art should understand that they can make various changes, substitutions and alterations herein without departing from the spirit and scope of the invention in its broadest form.

What is claimed is:

1. For use in a transceiver capable of operating in a high frequency Ethernet local area network (LAN), wherein the transceiver comprises front-end analog signal processing circuitry capable of at least one of: 1) transmitting an outgoing analog signal to an external cable via a transformer, 2) reducing a DC component in an incoming analog signal, and 3) reducing an echo of the outgoing analog signal in the incoming analog signal, and wherein the front-end analog signal processing circuitry comprises an automatic gain control (AGC) circuit capable of amplifying the incoming analog signal by an adjustable gain factor, an AGC controller comprising:

a first circuit capable of determining an absolute value of an output signal of said front-end signal processing circuitry;

comparison circuitry capable of comparing said absolute value of said output signal to a pre-determined threshold value and generating a gain control signal in response to said comparison, wherein said comparison circuitry sets said gain control signal to a first gain control value when said absolute value exceeds said pre-determined threshold value and sets said gain control signal to a second gain control signal when said absolute value does not exceed said pre-determined threshold value; and a gain adjustment circuit capable of modifying said adjustable gain factor of said AGC circuit according to said first gain control value and said second gain control value.

2. The AGC controller as set forth in claim 1 further comprising:

a digital peak detector capable of detecting a peak of a digital output signal that represents said output signal of said front-end signal processing circuitry;

wherein said first circuitry is capable of determining an absolute value of said peak of said digital output signal; and wherein said comparison circuitry is capable of comparing said absolute value of said peak of said digital output signal to said pre-determined threshold value.

3. The AGC controller as set forth in claim 2 wherein said comparison circuitry is capable of decrementing said gain control signal for said AGC circuit when said absolute value of said peak of said digital output signal is greater than said pre-determined threshold value.

4. The AGC controller as set forth in claim 2 wherein said comparison circuitry is capable of incrementing said gain control signal for said AGC circuit when said absolute value of said peak of said digital output signal is not greater than said pre-determined threshold value.

5. The AGC controller as set forth in claim 4 wherein said comparison circuitry is capable of continuously incrementing said gain control signal for said AGC circuit at a relatively slow bleed rate.

6. The AGC controller as set forth in claim 1 wherein said gain adjustment circuit comprises:

an adder circuit having a first input coupled to an output of said comparison circuitry;

a register capable of providing a gain control signal to said AGC circuit wherein an input of said register is coupled to an output of said adder circuit; and a delay element having an input coupled to an output of said register and an output coupled to a second input of said adder circuit.

7. The AGC controller as set forth in claim 6 wherein said comparison circuit is capable of outputting to said adder circuit a logic signal of negative one when said absolute value of said output signal is greater than said pre-determined threshold value and outputting to said adder circuit a logic signal of positive one when said absolute value of said output signal is not greater than said pre-determined threshold value.

8. A transceiver capable of operating in a high frequency Ethernet local area network (LAN), wherein the transceiver comprises front-end analog signal processing circuitry capable of at least one of: 1) transmitting an outgoing analog signal to an external cable via a transformer, 2) reducing a DC component in an incoming analog signal, and 3) reducing an echo of the outgoing analog signal in the incoming analog signal, and wherein the front-end analog signal processing circuitry comprises an automatic gain control (AGC) circuit capable of amplifying the incoming analog signal by an adjustable gain factor, said transceiver comprising an AGC controller comprising:

a first circuit capable of determining an absolute value of an output signal of said front-end signal processing circuitry;

comparison circuitry capable of comparing said absolute value of said output signal to a pre-determined threshold value and generating a gain control signal in response to said comparison, wherein said comparison circuitry sets said gain control signal to a first gain control value when said absolute value exceeds said pre-determined threshold value and sets said gain control signal to a second gain control signal when said absolute value does not exceed said pre-determined threshold value; and a gain adjustment circuit capable of modifying said adjustable gain factor of said AGC circuit according to said first gain control value and said second gain control value.

9. The transceiver as set forth in claim 8 wherein said AGC controller further comprises:

a digital peak detector capable of detecting a peak of a digital output signal that represents said output signal of said front-end signal processing circuitry;

wherein said first circuitry is capable of determining an absolute value of said peak of said digital output signal; and wherein said comparison circuitry is capable of comparing said absolute value of said peak of said digital output signal to said pre-determined threshold value.

10. The transceiver as set forth in claim 9 wherein said comparison circuitry is capable of decrementing said gain control signal for said AGC circuit when said absolute value of said peak of said digital output signal is greater than said pre-determined threshold value.

11. The transceiver as set forth in claim 9 wherein said comparison circuitry is capable of incrementing said gain control signal for said AGC circuit when said absolute value of said peak of said digital output signal is not greater than said pre-determined threshold value.

12. The transceiver as set forth in claim 11 wherein said comparison circuitry is capable of continuously incrementing said gain control signal for said AGC circuit at a relatively slow bleed rate.

13. The transceiver as set forth in claim 8 wherein said gain adjustment circuit comprises:

an adder circuit having a first input coupled to an output of said comparison circuitry;

a register capable of providing a gain control signal to said AGC circuit wherein an input of said register is coupled to an output of said adder circuit; and a delay element having an input coupled to an output of said register and an output coupled to a second input of said adder circuit.

14. The transceiver as set forth in claim 13 wherein said comparison circuit is capable of outputting to said adder circuit a logic signal of negative one when said absolute value of said output signal is greater than said pre-determined threshold value and outputting to said adder circuit a logic signal of positive one when said absolute value of said output signal is not greater than said pre-determined threshold value.

15. A method for controlling an automatic gain control (AGC) circuit in a transceiver capable of operating in a high frequency local area network, said method comprising the steps of:

receiving in an AGC controller an output signal from front-end signal processing circuitry of said transceiver;

determining an absolute value of said output signal;

comparing said absolute value to a pre-determined threshold value;

generating a gain control signal for said AGC circuit in response to said comparison;

setting said gain control signal to a first gain control value when said absolute value exceeds said pre-determined threshold value; and setting said gain control signal to a second gain control value when said absolute value exceeds said pre-determined threshold value.

16. The method as set forth in claim 15 further comprising the steps of:

detecting a peak of a digital output signal that represents said output signal of said front-end signal processing circuitry;

determining an absolute value of said peak of said digital output signal;

comparing said absolute value of said peak of said digital output signal to said pre-determined threshold value.

17. The method as set forth in claim 16 further comprising the step of:

decrementing said gain control signal for said AGC circuit when said absolute value of said peak of said digital output signal is greater than said pre-determined threshold value.

18. The method as set forth in claim 16 further comprising the step of:

incrementing said gain control signal for said AGC circuit when said absolute value of said peak of said digital output signal is not greater than said pre-determined threshold value.

19. The method as set forth in claim 16 wherein said step of decrementing said gain control signal for said AGC circuit when said absolute value of said peak of said digital output signal is greater than said pre-determined threshold value comprises the steps of:

providing to a first input of an adder circuit a logic signal of negative one;

providing to a second input of said adder circuit a previous value of said gain control signal for said AGC circuit;

adding in said adder circuit said logic signal of negative one and said previous value of said gain control signal for said AGC circuit to create a decremented value of said gain control signal for said AGC circuit;

providing to said AGC circuit said decremented value of said gain control signal for said AGC circuit.

20. The method as set forth in claim 16 wherein said step of incrementing said gain control signal for said AGC circuit when said absolute value of said peak of said digital output signal is not greater than said predetermined threshold value comprises the steps of:

providing to a first input of an adder circuit a logic signal of positive one;

providing to a second input of said adder circuit a previous value of said gain control signal for said AGC circuit;

adding in said adder circuit said logic signal of positive one and said previous value of said gain control signal for said AGC circuit to create an incremented value of said gain control signal for said AGC circuit;

providing to said AGC circuit said incremented value of said gain control signal for said AGC circuit.

* * * * *